(12) United States Patent
Katta et al.

(10) Patent No.: US 10,892,775 B1
(45) Date of Patent: Jan. 12, 2021

(54) TRANSMITTING SYSTEM, APPARATUS AND METHOD FOR UNIFYING PARALLEL INTERFACES

(71) Applicant: Samsung Electronics Co., Ltd., Suwon-si (KR)

(72) Inventors: Umamaheswara Reddy Katta, Bengaluru (IN); Tamal Das, Bengaluru (IN)

(73) Assignee: SAMSUNG ELECTRONICS CO., LTD, Gyeonggi-do (KR)

( * ) Notice: Subject to any disclaimer, the term of this patent is extended or adjusted under 35 U.S.C. 154(b) by 0 days.

(21) Appl. No.: 16/796,232

(22) Filed: Feb. 20, 2020

(30) Foreign Application Priority Data

Dec. 3, 2019 (IN) .............................. 201941049609

(51) Int. Cl.
*H03M 9/00* (2006.01)
*H03K 5/135* (2006.01)

(52) U.S. Cl.
CPC .............. *H03M 9/00* (2013.01); *H03K 5/135* (2013.01)

(58) Field of Classification Search
CPC ................................. H03M 9/00; H03K 5/135
USPC ......................................................... 341/101
See application file for complete search history.

(56) References Cited

U.S. PATENT DOCUMENTS

| | | | | |
|---|---|---|---|---|
| 6,549,045 B1* | 4/2003 | Wang | ......................... | G06F 1/08 327/115 |
| 6,731,142 B1* | 5/2004 | Wang | ......................... | G06F 1/08 327/115 |
| 7,187,738 B2* | 3/2007 | Naven | ....................... | H03L 7/07 375/355 |
| 7,307,558 B1* | 12/2007 | Karim | ..................... | H03M 9/00 341/100 |
| 7,864,084 B2 | 1/2011 | Padaparambil | | |
| 8,504,489 B2* | 8/2013 | Richards | ................ | G06Q 10/06 706/12 |
| 8,570,197 B2 | 10/2013 | Nguyen et al. | | |
| 10,333,507 B2* | 6/2019 | Fujita | ................... | H03K 5/2481 |
| 2002/0067787 A1* | 6/2002 | Naven | ....................... | H03L 7/07 375/359 |
| 2012/0176159 A1* | 7/2012 | Webb, III | ............... | G04F 10/00 327/18 |
| 2013/0318287 A1* | 11/2013 | Pyeon | ................. | G06F 12/0246 711/103 |
| 2017/0060218 A1 | 3/2017 | Zhang et al. | | |
| 2017/0220517 A1 | 8/2017 | Khan et al. | | |

\* cited by examiner

*Primary Examiner* — Jean B Jeanglaude
(74) *Attorney, Agent, or Firm* — Harness, Dickey & Pierce, P.L.C.

(57) ABSTRACT

Various example embodiments relate to unifying a plurality of parallel interfaces. A transmitting apparatus configured to serialize parallel bits implements a dynamic divider circuit for loading varying parallel bits into the transmitting apparatus. An input clock generator is configured to generate a desired and/or predefined clock frequency. The dynamic divider circuit receives the desired and/or predefined clock frequency and generates a parallel clock frequency by dividing the desired and/or predefined clock frequency based on a variable division input. Number of parallel bits loaded into the transmitting apparatus is based on the generated parallel clock frequency. Further, a shift register generates a bit stream from the parallel bits loaded into the shift register and the generated bit stream is converted to serial bit by a multiplexer.

20 Claims, 15 Drawing Sheets

TRANSMITTING SYSTEM, APPARATUS AND METHOD FOR UNIFYING PARALLEL INTERFACES

CROSS-REFERENCE TO RELATED APPLICATION

This U.S. non-provisional application claims the benefit of priority under 35 U.S.C. § 119 to Indian Patent Application No. 201941049609, filed on Dec. 3, 2019, in the Office of the Controller General of Patents, Designs & Trade Marks, the disclosure of which is incorporated by reference herein in its entirety.

FIELD

Various example embodiments of the inventive concepts relate in general to a transmitting apparatus for serial interface applications, and more particularly to a method, system, apparatus, and/or non-transitory computer readable medium for unifying parallel interfaces in a parallel to serial interface transmitting apparatus.

BACKGROUND

High-speed transmitting apparatuses are used in serial interface applications for converting parallel data to serial data. Many applications like High Definition Multimedia Interface (HDMI), Peripheral Component Interconnect express (PCIe), Universal Serial Bus (USB), Display Protocol (DP), and the like, require high speed serial interfaces for serializing parallel data (typically ranging from 4 Gbps to 24 Gbps). The existing high-speed transmitting apparatuses comprise clock dividers in a Physical layer (PHY) for generating a parallel clock frequency according to the number of parallel input bits to be serialized (e.g., convert parallel data into serial data). For example, a first parallel clock signal is generated for 8 parallel input bits, a second parallel clock signal is generated for 10 parallel input bits and so forth.

Conventional parallel interfaces like HDMI, eRVDS, PCIe, USB3.1, etc., have different data widths, therefore the number of parallel bits vary among the different parallel interfaces. Hence, applications like televisions, cameras, etc., supporting different parallel interfaces require separate and/or different serializer circuits for serializing input bits received from the different parallel interfaces. Hence, additional hardware is required to serialize the varying parallel bits to accommodate the various parallel interfaces.

The information disclosed in this background of the disclosure section is only for the enhancement of understanding of the general background of the invention and should not be taken as an acknowledgement or any form of suggestion that this information forms the prior art already known to a person skilled in the art.

SUMMARY

In at least one example embodiment, a transmitting apparatus for unifying parallel interfaces is disclosed. The transmitting apparatus may include an input clock generator configured to generate an input clock signal of a desired frequency; a dynamic divider circuit configured to receive the input clock signal, generate a parallel clock signal by dividing the desired frequency of the input clock signal based on a variable division input, the variable division input selected based on a variable parallel data input, and provide the parallel clock signal to one or more shift registers; the one or more shift registers configured to receive the variable parallel data input based on the parallel clock signal, and shift the variable parallel data input to generate a bit stream; and at least one multiplexer associated with a serial clock signal, the at least one multiplexer configured to receive the bit stream from each of the one or more shift registers, and output at least one bit of a serial bit stream based on a serial clock frequency of the serial clock signal.

In at least one example embodiment, a method for unifying parallel interfaces of a transmitting apparatus is disclosed. The method may include receiving, by a dynamic divider circuit, an input clock signal, the input clock signal including a desired clock frequency; generating, by the dynamic divider circuit, a parallel clock signal by dividing the desired clock frequency of the input clock signal based on a variable division input, the variable division input is selected based on a variable parallel data input; providing, by the dynamic divider circuit, the parallel clock signal to one or more shift registers; receiving, by the one or more shift registers, the variable parallel data input based on the parallel clock frequency; shifting, by the one or more shift registers, the variable parallel data input to generate a bit stream; receiving, by at least one multiplexer, the bit stream from each of the one or more shift registers; and outputting, by the at least one multiplexer, at least one bit of a serial bit stream based on a serial clock frequency of a serial clock signal associated with the at least one multiplexer.

In at least one example embodiment, a method for high speed serialization of parallel input bits to be serialized is disclosed. The method may include configuring a dynamic divider circuit based on an input clock signal; setting the dynamic divider circuit at a first variable division of the input clock signal for loading the parallel input bits into one or more shift registers, the one or more shift registers connected to an output of at least one multiplexer that receives the parallel input bits; and generating a serial data output based on loading and shifting the parallel input bits using the one or more shift registers.

The foregoing summary is illustrative only and is not intended to be in any way limiting. In addition to the illustrative aspects, example embodiments, and features described above, further aspects, example embodiments, and features will become apparent by reference to the drawings and the following detailed description.

BRIEF DESCRIPTION OF THE DRAWINGS

The novel features and characteristic of various example embodiments of the inventive concepts are set forth in the appended claims. The disclosure itself, however, as well as further objectives and advantages thereof, will best be understood by reference to the following detailed description of various illustrative example embodiments when read in conjunction with the accompanying figures. One or more example embodiments are now described, by way of example only, with reference to the accompanying figures wherein like reference numerals represent like elements and in which:

Figure 1:
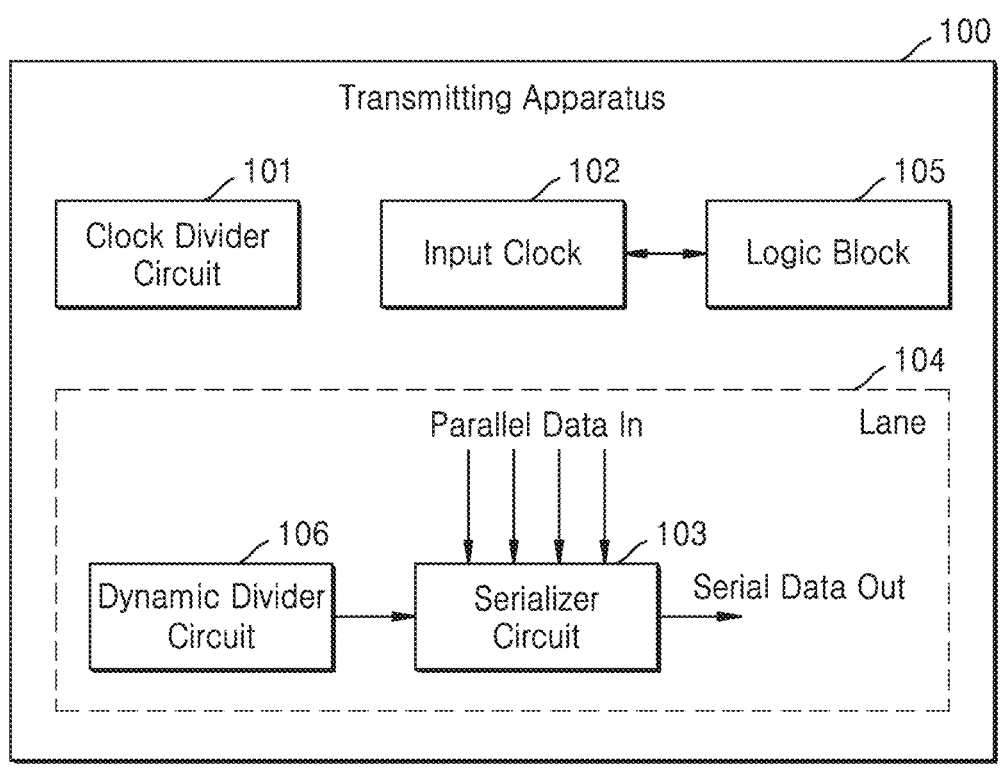
FIG. 1 shows an example simplified block diagram of a transmitting apparatus, in accordance with at least one example embodiment.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a specially programmed computer, or special purpose processor and/or processing device, such as at least one processor (and/or processor core) loaded with special purpose computer readable instructions to perform the methods of the example embodiments, or specially configured and/or programmed processing devices, such as ASICs, FPGAs, neural networks, distributed processing networks, cloud processing networks, etc., whether or not such computer or processor is explicitly shown.

DETAILED DESCRIPTION

In the present document, the word "exemplary" is used herein to mean "serving as an example, instance, or illustration." Any example embodiment or implementation of the present subject matter described herein as "exemplary" is not necessarily to be construed as preferred or advantageous over other example embodiments.

While the inventive concepts disclosed are susceptible to various modifications and alternative forms, specific example embodiments thereof have been shown by way of example in the drawings and will be described in detail below. It should be understood, however that it is not intended to limit the inventive concepts to the particular forms disclosed, but on the contrary, the inventive concepts are to cover all modifications, equivalents, and alternatives falling within the scope of the inventive concepts.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or apparatus.

Communication systems for transmitting data may operate according to a number of standards and implementations. One such implementation is a serializer de-serializer (SERDES) communication channel that takes a given number of data bits from a digital domain, serializes the data, and transmits the data to a receiver that deserializes it for another digital domain. SERDES data transmission implementations can be used in a wide range of communication systems and devices, such as mobile devices, desktop computers and servers, computer networks, and/or telecommunication networks, etc.

Various example embodiments relate to a unifying parallel interface. According to at least one example embodiment, a transmitting apparatus configured to serialize parallel bits implements a dynamic divider circuit for loading varying numbers of parallel bits into the transmitting apparatus. An input clock (e.g., input clock generator, a phased locked loop (PLL), etc.) is configured to generate a desired and/or predefined clock frequency. The dynamic divider circuit receives the desired and/or predefined clock frequency and generates a parallel clock frequency by dividing the desired and/or predefined clock frequency based on a variable division input. The number of parallel bits loaded into the transmitting apparatus is based on the generated parallel clock frequency. Further, a shift register generates a bit stream from the parallel bits loaded into the shift register and the generated bit stream is converted to serial bit by a multiplexer, etc.

FIG. 1 shows a simplified block diagram of a transmitting apparatus (100), in accordance with at least one example embodiment. According to at least one example embodiment, the transmitting apparatus (100) is a serializer de-serializer (SERDES) transmitter. The transmitting apparatus (100) may be a multi-lane transmitting apparatus, but is not limited thereto. The transmitting apparatus (100) can follow serial interface standards including, but not limited to, HDMI, PCIe, USB, DP, and/or any other standards including multi-lane high speed serial data to parallel data (or vice versa) conversion. A person skilled in the art would immediately comprehend that the proposed solution(s) can be applied in different applications, like televisions (TV), personal computers, laptops, tablets, smartphones, and/or any other electronic appliance having parallel to serial interface for serializing data. Various example embodiments can be incorporated into various types of communication systems, such as intra-computer data transmission structures (e.g., peripheral component interconnect (PCI) express bus), telecommunication networks, local area networks (LAN), wireless local area networks (WLAN), wired and wireless point-to-point connections, optical data transmission systems, and/or other types of communication systems using SERDES transmitters. A physical (PHY) layer of the transmitting apparatus (100) comprises a clock divider circuit (101), an input clock (102) (e.g., input clock generator and/or a Phase Locked Loop (PLL), etc.), a logic block (105), and/or at least one lane (104), but the example embodiments are not limited thereto.

In at least one example embodiment, the input clock (102) is a feedback system that generates an output signal having a phase related to a phase of an input reference signal. Generally, the input clock (102) is designed to generate a high-speed clock and also reduce error between the input phase and the output phase to zero and/or substantially close to zero. The input clock (102) is used in the transmitting apparatus (100) for generating high-speed clock signals, and in data recovery circuits (not shown), etc.

In at least one example embodiment, the transmitting apparatus (100) can have N lanes (not shown), where N can be greater than or equal to 2. Each lane may receive corresponding parallel clock signals. The respective parallel clock signals may be used as a clock to drive data (bits) on each lane. In at least one example embodiment, the phase of the parallel clock in each lane is adjusted using existing techniques. The phase of a parallel clock of a lane can be aligned with the parallel clock of the other lanes. Thus, the bits in each lane is aligned with each other (e.g., the plurality of lanes are synchronous to each other). In at least one example embodiment, each serializer circuit can have a dynamic divider circuit (106) for generating a parallel clock frequency according to variable division input. In a first example, the dynamic divider circuit (106) can be implemented as /5, /4, /5, /4 counter (e.g., 2 divide-by-5 counters and 2 divide-by-4 counters) for 36-bit parallel input bits. In a second example, the dynamic divider circuit (106) can be implemented as /5, /5, /5, /5 counter (e.g., 4 divide-by-5 counters) for 40-bit parallel input bits. However, the example embodiments are not limited thereto and other configurations may be used for the dynamic divider circuit, etc.

In at least one example embodiment, the logic block (105) may comprise a phase detector (not shown) for detecting a phase difference between the N lanes (104). If any of the lanes are out of sync (e.g., have a phase difference), then the logic block (105) enables the input clock and/or PLL (102) to publish a sync reset signal synchronous to the high-speed clock signal to each lane. Upon resetting, each lane may operate from a desired and/or predefined state. The sync reset signal is used to sync each lane ($104_1, \ldots 104_n$) of the transmitting apparatus (100).

Figure 2:
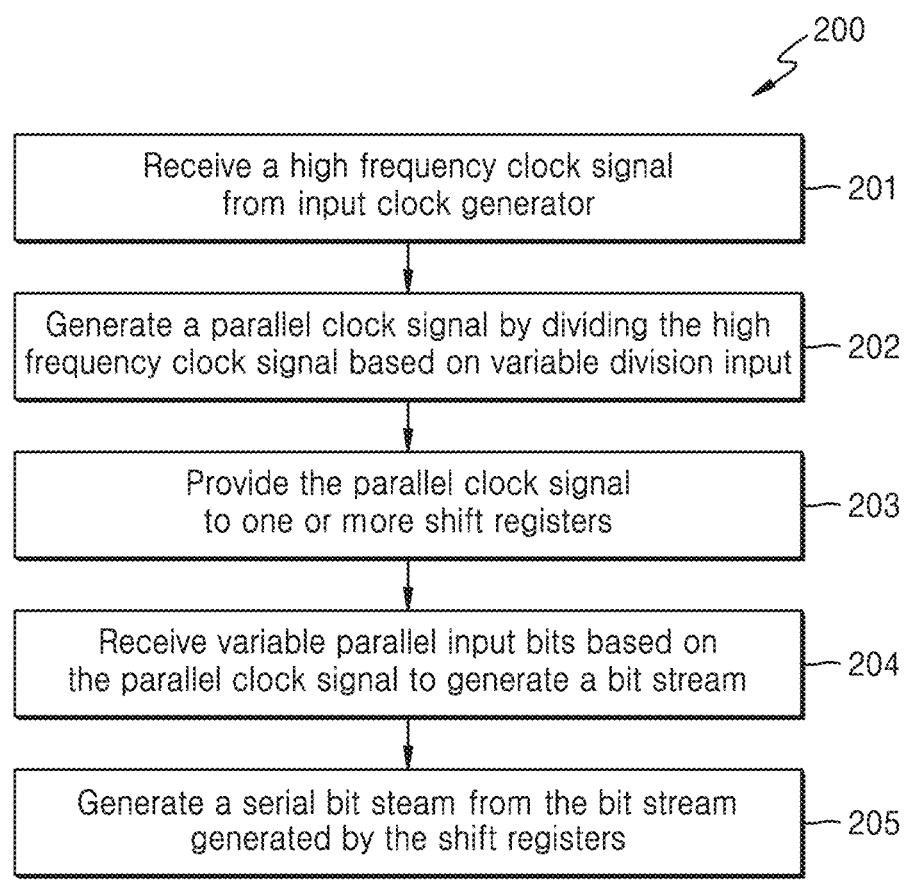
FIG. 2 shows an example flowchart illustrating method steps for unifying parallel interfaces in a transmitting apparatus, in accordance with at least one example embodiment.

FIG. 2 shows a flowchart illustrating method steps for unifying parallel interfaces in a transmitting apparatus, in accordance with at least one example embodiment.

As illustrated in FIG. 2, the method (200) may comprise one or more steps. The method (200) may be described in the general context of computer executable instructions. Generally, computer executable instructions can include special purpose routines, programs, objects, components, data structures, procedures, modules, and/or functions, etc., which perform particular functions or implement particular abstract data types for performing the methods of the example embodiments.

The order in which the method (200) is described is not intended to be construed as a limitation, and any number of the described method blocks can be combined in any order to implement the method. Additionally, individual blocks may be deleted from the methods without departing from the scope of the subject matter described herein. Furthermore, the method can be implemented in any suitable hardware, hardware and software, hardware firmware, etc., or combination thereof.

At step 201, the input clock (102) (e.g., input clock generator) generates a high-speed clock signal, and a sync reset signal synced to the high-speed clock signal (e.g., high frequency clock signal, etc.). As described, the input clock (102) is used to sync the plurality of lanes ($104_1, \ldots 104_n$). The input clock (102) may be capable of generating a high-speed clock signal having a desired and/or predefined frequency ranging from, for example, 1 GHz to 5 GHz, etc., but the example embodiments are not limited thereto. The input clock (102) may also be configured to generate the sync reset signal. The dynamic divider circuit (106) then receives the high-speed clock signal and/or the sync reset signal from the input clock (102).

At step 202, the dynamic divider circuit generates a parallel clock frequency (e.g., a parallel clock signal) by dividing the high-speed clock signal based on a variable division input, the variable division input being based on the data width of the parallel interface (e.g., how many bits of data are transmitted, received, and/or processed by the parallel interface in a single clock cycle). The parallel clock signal may be of a desired and/or predefined parallel clock frequency. Additionally, according to at least one example embodiment, the variable division input may be input (e.g., selected) by a user.

At step 203, the dynamic divider circuit (106) provides the parallel clock signal (e.g., parallel clock frequency, etc.) to one or more shift registers in the serializer circuit (103).

At step 204, the one or more shift registers load the parallel input bits (e.g., parallel interface input data) based on the parallel clock signal and shift the parallel input bits based on the input clock signal. Further, the one or more shift registers generate a bitstream comprising odd bits and even bits.

At step 205, a multiplexer of the serializer (103) receives the bit stream from the one or more shift registers and generates a serial bit stream.

Figure 3:
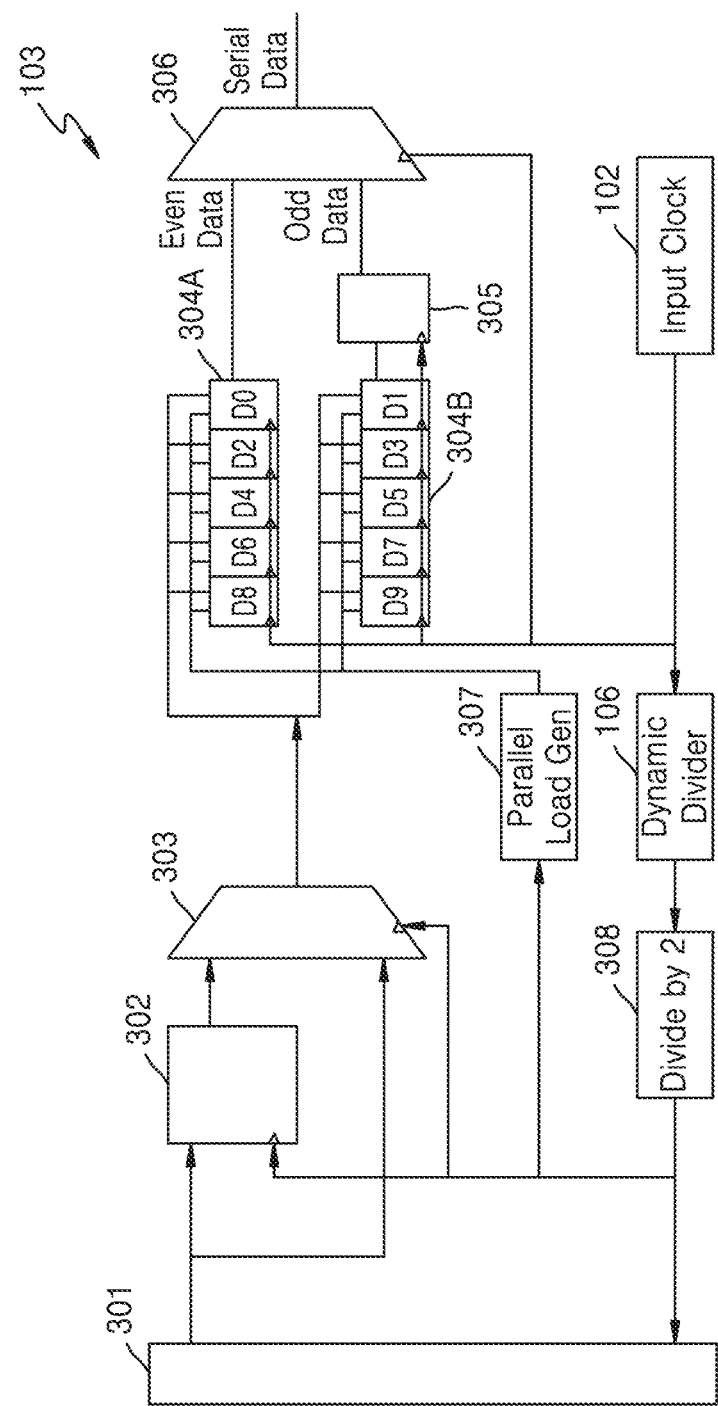
FIG. 3 shows an example block diagram of a half-rate serializer circuit for unifying 16-bit, 18-bit and 20-bit parallel interfaces, in accordance with at least one example embodiment.

Referring now to FIG. 3, an example block diagram of a half-rate serializer circuit (103) is shown for unifying 16-bit, 18-bit and 20-bit parallel interface according to some example embodiments. As shown in FIG. 3, the serializer circuit (103) comprises the input clock (102), the dynamic divider circuit (106), a divide by 2 circuit (308), a link layer processor (301) or a Physical Coding Sublayer (PCS), a latch/flip-flop (302), a multiplexer (303), a parallel load gen (307), a shift register (304A), a shift register (304B), a flip-flop (305), and/or a multiplexer (306), but the example embodiments are not limited thereto, and the serializer circuit may include a greater or lesser number of constituent components. The input clock (102) (e.g., input clock generator, PLL, etc.) generates the high speed clock signal (e.g., high frequency clock signal, etc.). The dynamic divider circuit (106) receives the high frequency clock signal (e.g., high speed clock signal) and generates the parallel clock signal (e.g., the parallel clock frequency) based on the variable division input. According to at least one example embodiment, for loading 18-bit parallel input bits, the dynamic divider circuit (106) may implement functions of a /5 counter (e.g., divide-by-5 counter) followed by /4 counter (e.g., divide-by-4 counter), however the example embodiments are not limited thereto, for example the dynamic divider circuit may be used to load different parallel input data widths and/or different counter configurations. The resultant of the dynamic divider circuit (106) is provided to the /2 circuit (308) (e.g., divide-by-2 circuit). An output of the /2 circuit (308) is a divided by 18 clock signal. In another example embodiment, for loading 20-bit parallel input bits, the dynamic divider circuit (106) may implement functions of a /5 counter followed by another /5 counter. The resultant of the dynamic divider circuit (106) is provided to the /2 circuit (308). An output of the /2 circuit (308) is a divided by 20 clock signal (e.g., a clock signal that has been divided by 20). The divided by 20 clock signal is provided to the link layer processor (301). The link layer processor (301) provides the parallel input bits to the latch/flip-flop (302). Also, the parallel input bits are provided to the multiplexer (303). The latch/flip-flop (302) is used to shift the parallel input bits (e.g., parallel input data) such that the output of the multiplexer (303) is continuous and is arranged in order. The multiplexer (303) outputs the two input bits according to the divided by 18 clock signal or divide by 20 clock signal.

Further, the multiplexer (303) provides the multiplexed bits to the shift registers (304A and 304B). The parallel load generator (307) (e.g., a serial clock generator, etc.) generates a loading clock signal using the divided by 18 or 20 clock signal. The loading clock signal is used to load the multiplexed bits into the shift registers (304A and 304B). Thus, the dynamic divider circuit (106) facilitates loading 18-bits parallel input data or 20-bits parallel input data into the shift registers (304A and 304B) for serialization, based on the clock division performed by the dynamic divider circuit (106). The shift registers (304A and 304B) shifts the bits in respective shift registers using the input clock signal. In at least one example embodiment, the shift register (304A) generates even data and the shift register (304B) generates odd data. The even and odd data may be referred as even or odd bit streams. Further, the multiplexer (306) receives the bit streams as inputs, and the multiplexer (306) outputs a serial bit stream using the input clock signal. In another example embodiment, when the dynamic divider circuit (106) implements /4 counter followed by a second /4 counter, 16-bit parallel data can be loaded into the shift register (304A and 304B). Thus, the serializer circuit (103) as shown in FIG. 3 unifies the 16-bit parallel interface, 18-bit parallel interface and 20-bit parallel interface, but the example embodiments are not limited thereto.

Figure 4:
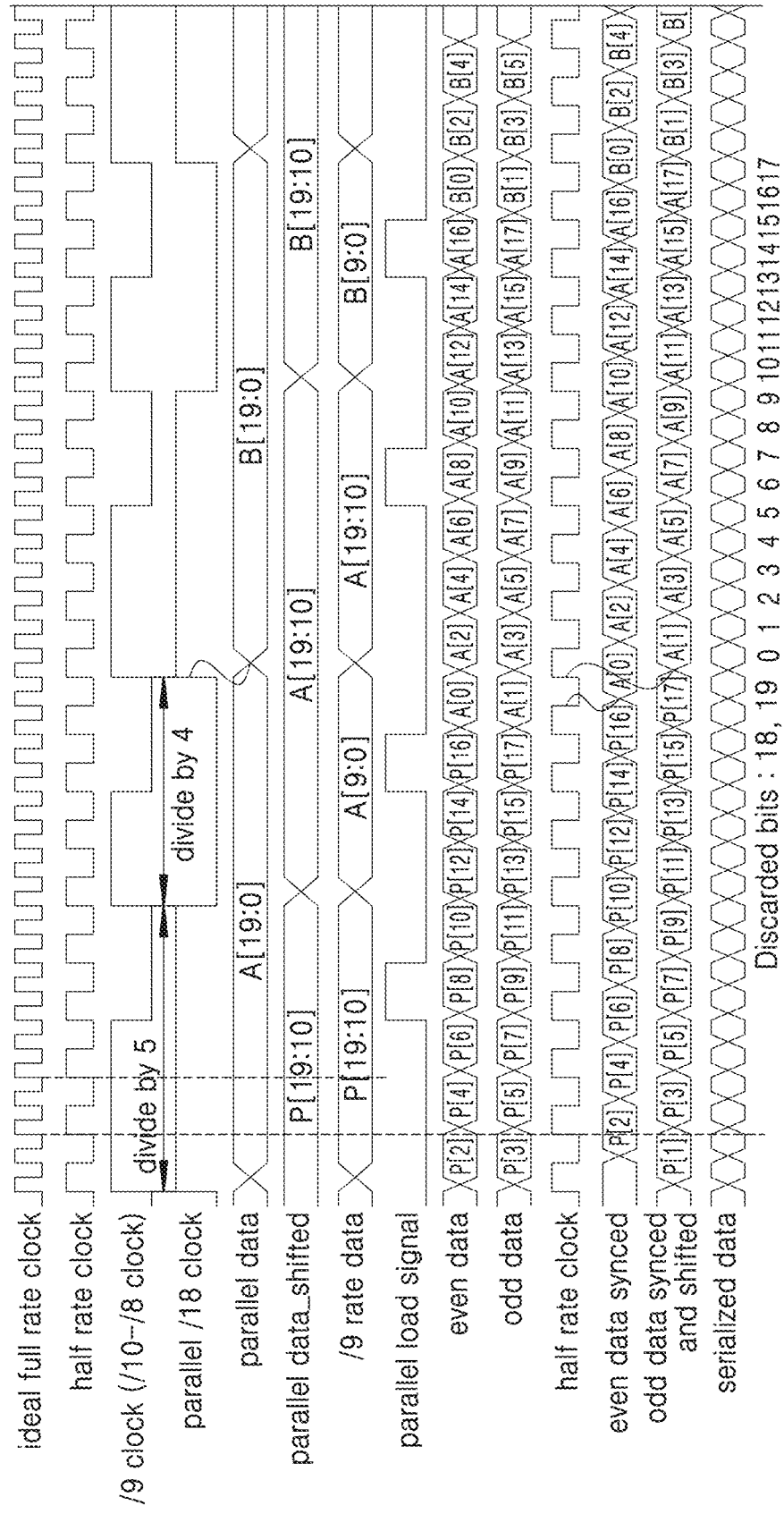
FIG. 4 shows an example timing diagram of a half-rate serializer circuit for 18-bit parallel interfaces, in accordance with at least one example embodiment.

FIG. 4 shows a timing diagram for serializing 18-bit parallel input data according to at least one example embodiment. As shown in FIG. 4, a desired and/or ideal full rate clock signal is reduced to a half rate clock signal (e.g., a clock signal that is half the frequency of the full rate clock signal, etc.). The half rate clock signal is used to generate the parallel clock signal (e.g., parallel clock frequency). The parallel clock frequency is further divided by a /2 divider circuit (308) to generate the divided by 18 clock signal. The 18-bit parallel input data is loaded into the shift registers (304A and 304B) at a loading rate equal to the divided by 18 clock signal. Further, the even bits and odd bits are generated using the shift registers (304A and 304B). In at least one example embodiment, the odd bits are shifted to generate an ordered serial bit stream, such that the serial bit stream comprises the even and odd bits consecutively (e.g., the even bits and the odd bits are interleaved to form the serial bit stream). The even and odd bits are generated using the half rate clock signal. Also, the multiplexer (306) uses the half rate clock signals to generate the serial bit stream from the even and odd bits.

In at least one example embodiment, the dynamic divider circuit (106) can be programmed to allow bit padding at the end of each word or the end of a pair of words. For example, for 18-bit serial data, a pad bit can be inserted after 9-bits or after 18-bits, etc., but the example embodiments are not limited thereto.

Figure 5:
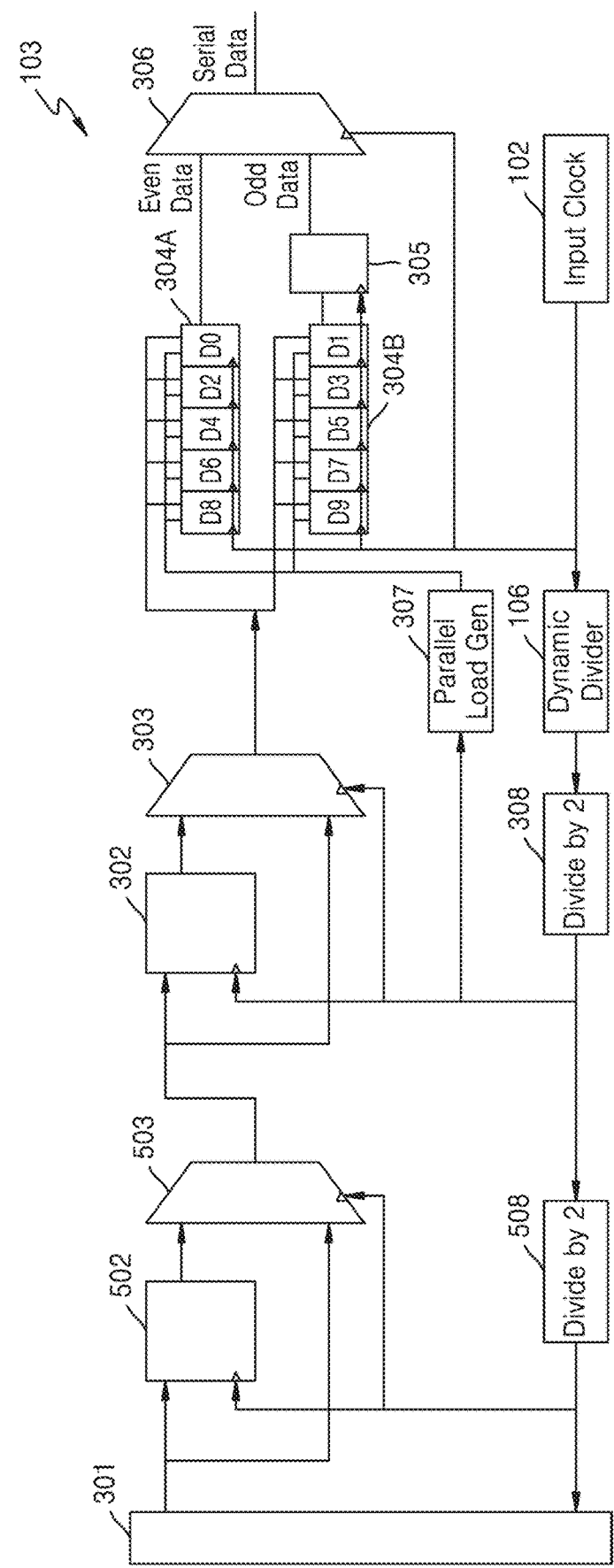
FIG. 5 shows an example block diagram of a half-rate serializer circuit for unifying 36-bit and 40-bit parallel interfaces, in accordance with at least one example embodiment.

Referring now to FIG. 5, an example block diagram of a half-rate serializer circuit (103) is shown for unifying 36-bit and 40-bit parallel interface according to at least one example embodiment. As shown in FIG. 5, the serializer circuit (103) comprises the input clock (102), the dynamic divider circuit (106), a divide by 2 circuit (308), a divide by 2 circuit (508), a link layer processor (301) or the PCS, a latch/flip-flop (502), a multiplexer (503), a latch/flip-flop (302), a multiplexer (303), a parallel load generator (307) (e.g., a serial clock generator), a shift register (304A) a shift register (304B), a flip-flop (305), and/or a multiplexer (306), but the example embodiments are not limited thereto and may include a greater or lesser number of constituent components. The input clock (102) (e.g., input clock generator and/or PLL, etc.) generates the high frequency clock signal (e.g., high speed clock signal). The dynamic divider circuit (106) receives the high frequency clock signal (e.g., high speed clock signal) and generates the parallel clock signal (e.g., parallel clock frequency) based on the variable division input. In one example embodiment, for loading 36-bit parallel input bits, the dynamic divider circuit (106) may implement functions of a /5 counter followed by /4 counter, but the example embodiments are not limited thereto. The output of the dynamic divider circuit (106) is provided to the /2 circuit (308). An output of the /2 circuit (308) is a divided by 18 clock signal. The divided by 18 clock signal is further provided to the divide by 2 circuit (508). The output of the divide by 2 circuit (508) is a divided by 36 clock signal.

In another example embodiment, for loading 40-bit parallel input bits, the dynamic divider circuit (106) may implement functions of a /5 counter followed by /5 counter, but is not limited thereto. The resultant of the dynamic divider circuit (106) is provided to the /2 circuit (308) and another /2 division results in a divided by 40 clock signal. The divided by 40 clock signal is provided to the link layer processor (301). The link layer processor (301) provides the parallel input bits (e.g., input data) to the latch/flip-flop (502). Also, the parallel input bits are provided to the multiplexer (503). The latch/flip-flop (502) is used to shift the parallel input bits such that the output of the multiplexer (503) is continuous and is arranged in order (e.g., is arranged in a desired and/or proper serial order). The multiplexer (503) outputs the two input bits according to the divided by 36 clock signal or divided by 40 clock signal. Further, the multiplexer (503) provides the multiplexed bits to another stage of latch/flip-flop (302) and multiplexer (303). The output of the multiplexer (303) is provided to the shift registers (304A and 304B). The parallel load generator (307) (e.g., serial clock generator) generates a loading clock signal (e.g., serial clock signal) using the divided by 36 or 40 clock signal. The loading clock signal is used to load the multiplexed bits into the shift registers (304A and 304B). Thus, the dynamic divider circuit (106) facilitates loading 36-bit parallel input data or 40-bit parallel input data into the shift register (304A and 304B) for serialization, based on the clock division performed by the dynamic divider circuit (106). The shift registers (304A and 304B) shifts the bits in respective shift registers using the input clock signal. In one example embodiment, the shift register (304A) generates even data and the shift register (304B) generates odd data. The even and odd data is referred to as even bit streams or odd bit streams, respectively, in the present disclosure. Further, the multiplexer (306) receives the bit streams as inputs, and outputs a serial bit stream using the input clock signal. Thus, the serializer circuit (103) as shown in FIG. 5 unifies the 36-bit parallel interface and 40-bit parallel interface, but is not limited thereto.

Figure 6:
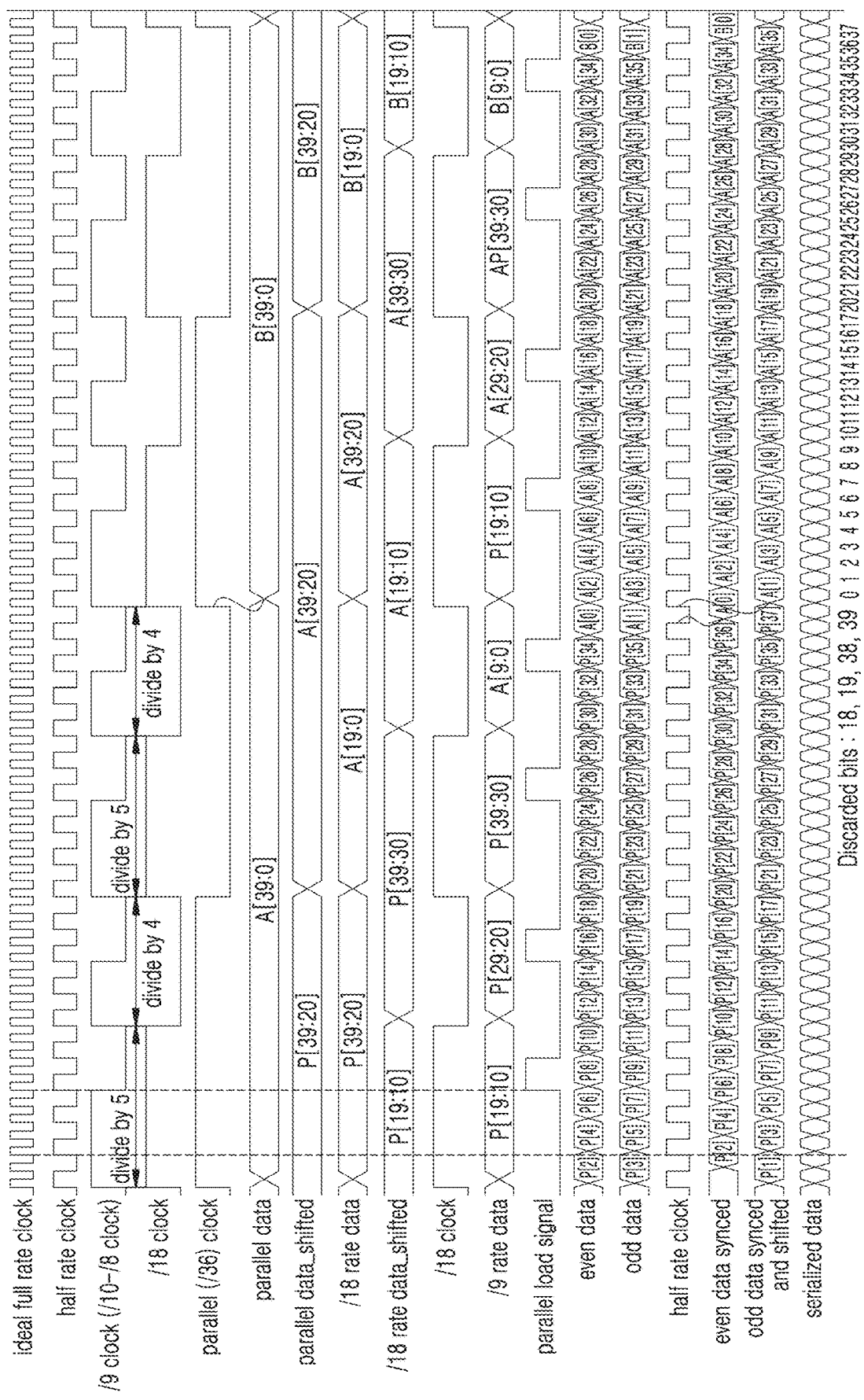
FIG. 6 shows an example timing diagram of a half-rate serializer circuit for 36-bit parallel interfaces, in accordance with at least one example embodiment.

FIG. 6 shows a timing diagram for serializing 36-bit parallel input data according to at least one example embodiment. As shown, a desired and/or ideal full rate clock signal is reduced to a half rate clock signal. The half rate clock signal is used to generate the parallel clock signal (e.g., parallel clock frequency). The parallel clock signal (e.g., parallel clock frequency) is further divided by a /2 divider circuit (308) and another /2 divider circuit (508) to generate the divided by 36 clock signal (e.g., the serial clock signal). The 36-bit parallel input data (e.g., input data) is loaded into the shift registers (304A and 304B) at a loading rate equal to the divided by 36 clock signal (e.g., the serial clock signal). Further, the even bits and odd bits are generated using the shift registers (304A and 304B). In one example embodiment, the odd bits are shifted to generate an ordered serial bit stream, such that the serial bit stream comprises the even and odd bits consecutively (e.g., the even bits and odd bits are interleaved). The even and odd bits are generated using the half rate clock signal. Also, the multiplexer (306) uses the half rate clock signals to generate the serial bit stream from the even and odd bits.

In at least one example embodiment, the dynamic divider circuit (106) can be programmed to allow bit padding at the end of 18-bits or after 36-bits.

Figure 7:
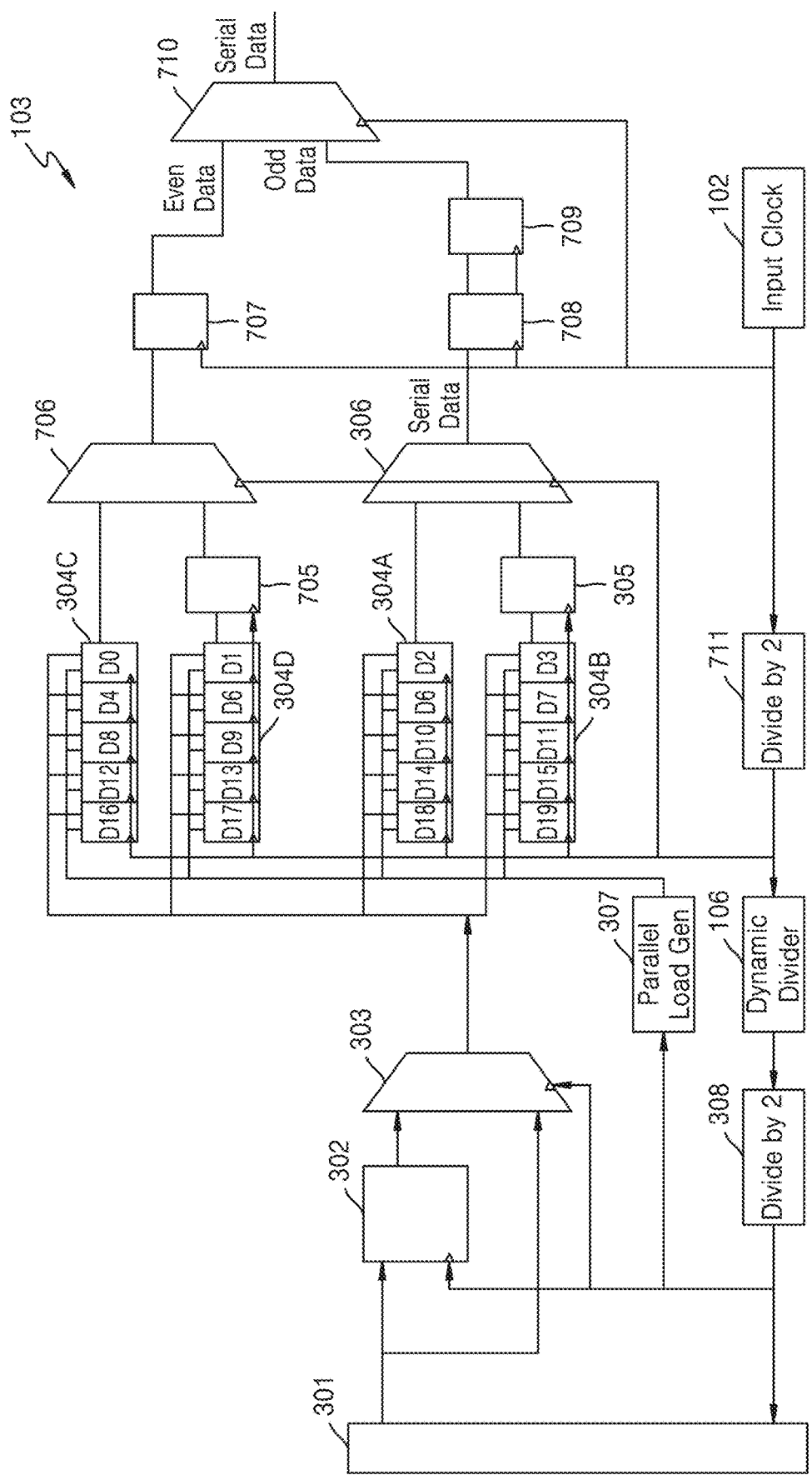
FIG. 7 shows an example block diagram of a quarter-rate serializer circuit for unifying 36-bit and 40-bit parallel interfaces, in accordance with at least one example embodiment.

Referring now to FIG. 7, an example block diagram of a quarter-rate serializer circuit (103) is shown for unifying 36-bit and 40-bit parallel interface according to at least one example embodiment. As shown in FIG. 7, the serializer circuit (103) comprises the input clock (102), the divide by 2 circuit (709), the dynamic divider circuit (106), a divide by 2 circuit (308), a link layer processor (301) or the PCS, a latch/flip-flop (302), a multiplexer (303), a parallel load generator (307), shift registers (304A, 304B, 304C and 304D), latch/flip-flops (305, 705, 707, 708 and 709), and/or multiplexers (706, 306 and 710), etc., but is not limited thereto. The input clock (102) (e.g., input clock generator, PLL, etc.) generates the high frequency clock signal (e.g., high speed clock signal). In at least one example embodiment, the input clock (102) generates a half-rate clock signal. The divide by 2 circuit (711) divides the high frequency clock signal using a /2 counter. The dynamic divider circuit (106) receives the divided by 2 clock signal and generates the parallel clock frequency based on the variable division input. In one example embodiment, for loading 36-bit parallel input bits, the dynamic divider circuit (106) may implement functions of a /5 counter followed by /4 counter, but the example embodiments are not limited thereto. The output of the dynamic divider circuit (106) is provided to the /2 circuit (308). An output of the /2 circuit (308) is a divided by 36 clock signal.

In another example embodiment, for loading 40-bit parallel input bits, the dynamic divider circuit (106) may implement functions of a /5 counter followed by /5 counter, but is not limited thereto. The output of the dynamic divider circuit (106) is provided to the /2 circuit (308) and results in a divided by 40 clock signal. The divided by 36 or 40 clock signal is provided to the link layer processor (301). The link layer processor (301) provides the parallel input bits to the latch/flip-flop (302). Also, the parallel input bits are provided to the multiplexer (303). The latch/flip-flop (302) is used to shift the parallel input bits such that the output of the multiplexer (303) is continuous and is arranged in order. The multiplexer (303) outputs the two input bits according to the divided by 36 clock signal or divider by 40 clock signal. Further, the output of the multiplexer (303) is provided to the shift registers (304A, 304B, 304C and 304D). The parallel load generator (307) generates a loading clock signal using the divided by 36 or 40 clock signal. The loading clock signal is used to load the multiplexed bits into the shift registers (304A, 304B, 304C and 304D). Thus, the dynamic divider circuit (106) facilitates loading 36-bit parallel input data or 40-bit parallel input data into the shift register (304A, 304B, 304C and 304D) for serialization, based on the clock division performed by the dynamic divider circuit (106). The shift registers (304A, 304B, 304C and 304D) shifts the bits in the respective shift registers using the input clock signal. In one example embodiment, the shift register (304A) generates a first data stream, the shift register (304B) generates a second data stream, the shift register (304C) generates a third data stream and the shift register (304D) generates a fourth data stream. The first and the second data streams are provided to the multiplexer (706) and the third and the fourth data streams are provided to the multiplexer (306). The output of the multiplexer (706 and 306) is provided to the multiplexer (710). Further, the multiplexer (710) outputs serial bit stream using the input clock signal. Thus, the serializer circuit (103) as shown in FIG. 7 unifies the 36-bit parallel interface and 40-bit quarter-rate parallel interfaces, but the example embodiments are not limited thereto.

Figure 8:
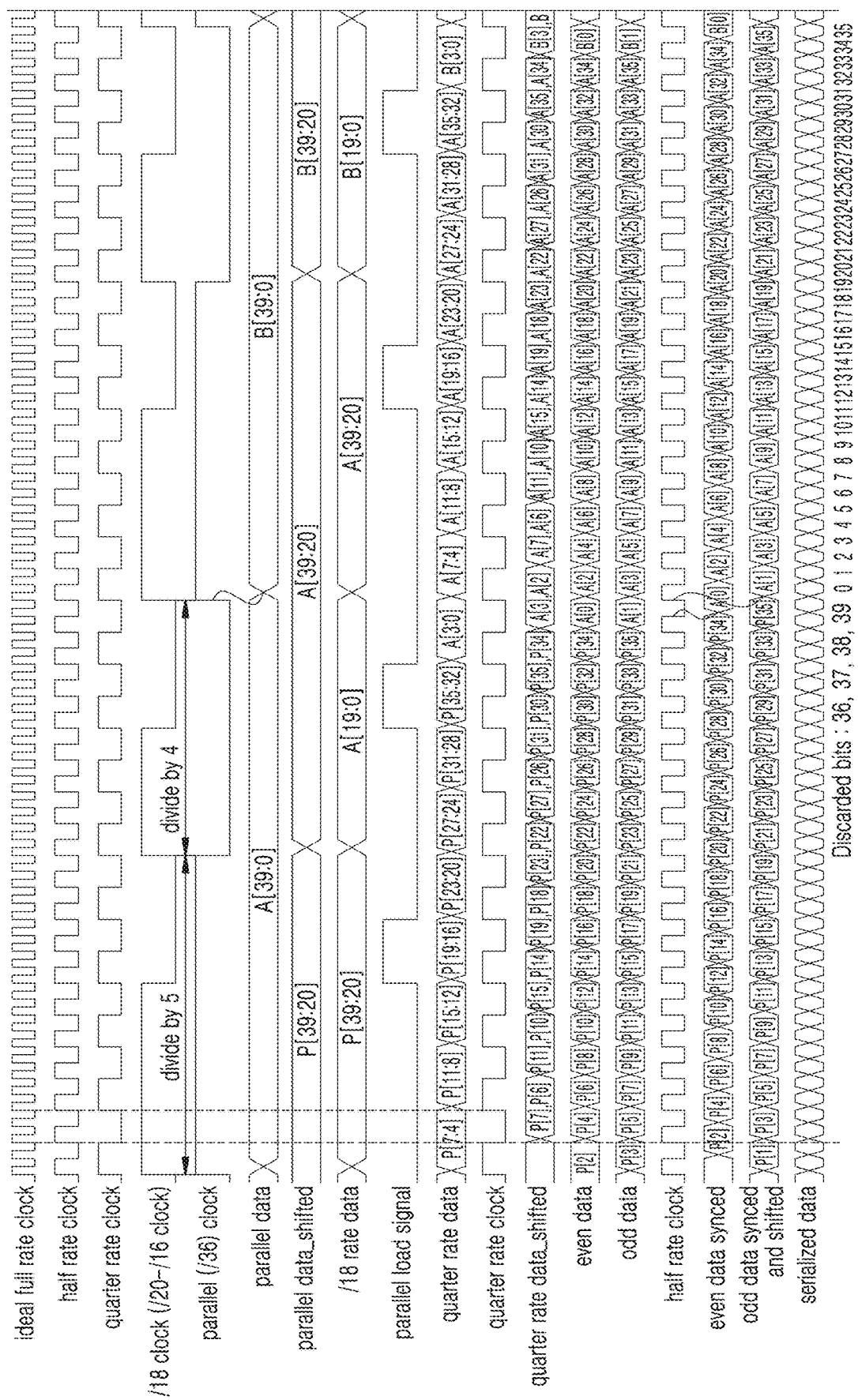
FIG. 8 shows an example timing diagram of a quarter-rate serializer circuit for 36-bit parallel interfaces, in accordance with at least one example embodiment.

FIG. 8 shows a timing diagram for serializing 36-bit quarter-rate parallel input data according to at least one example embodiment. As shown, a desired and/or ideal full rate clock signal is reduced to a half rate clock signal. The half rate clock signal is then divided by a /2 circuit (711) and the divided clock signal is used to generate the parallel clock signal (e.g., parallel clock frequency). The parallel clock signal (e.g., parallel clock frequency) is further divided by a /2 divider circuit (308) and another /2 divider circuit (308) to generate the divided by 36 clock signal. The 36-bit parallel input data is loaded into the shift registers (304A, 304B, 304C and 304D) at a loading rate equal to the divided by 36 clock signal. Further, the first, the second, the third and the fourth bit streams are generated using the shift registers (304A, 304B, 304C and 304D). The first and the second data streams are provided to the multiplexer (706) and the third and the fourth data streams are provided to the multiplexer (306). The output of the multiplexer (706 and 306) is provided to the multiplexer (710). Further, the multiplexer (710) outputs a serial bit stream using the input clock signal.

Figure 9A:
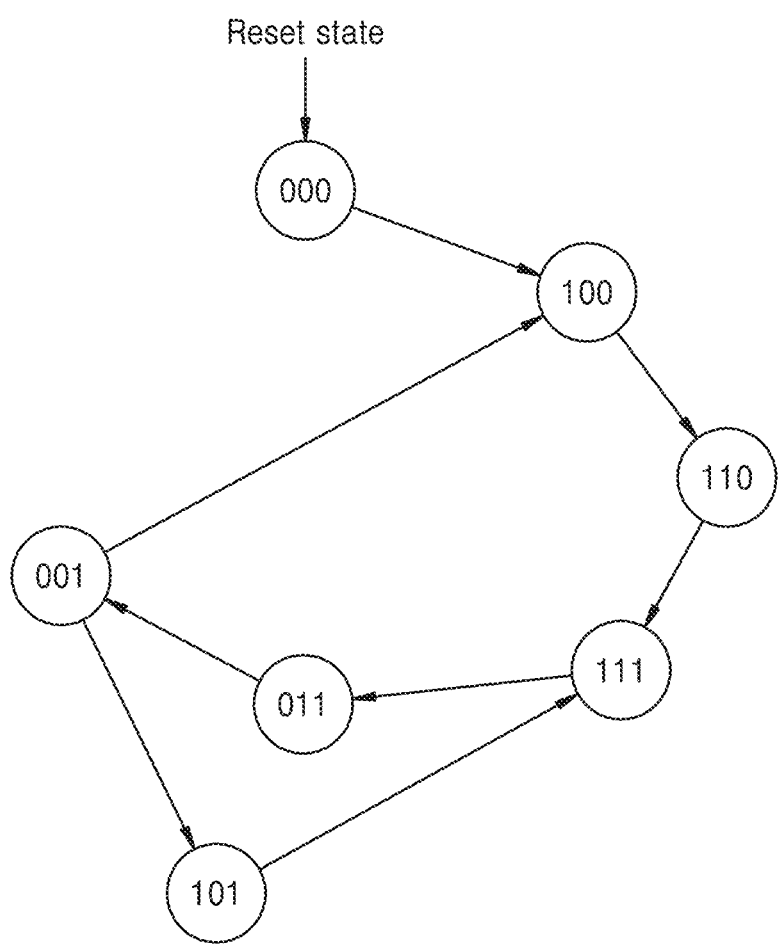
FIGS. 9A and 9B show example state diagrams for operating a dynamic divider for unifying parallel interfaces, in accordance with some example embodiments.

FIG. 9A shows a state diagram of the dynamic divider circuit (106) toggling between a /5 clock division and /4 clock division according to at least one example embodiment. In at least one example embodiment, when an input for generating a /18 clock division is received, the dynamic divider circuit (106) may be configured to perform a /5 division followed by a /4 division resulting in a /9 division. In at least one example embodiment, a subsequent /2 division results in a divided by 18 clock signal. In another example embodiment, the dynamic divider circuit (106) may repeat the /5 division and /4 division to generate a divided by 18 clock signal. As seen in the finite state machine of FIG. 9A, when the input is received for generating the parallel clock signal, the dynamic divider circuit (106) may begin in the state 000. The state 000 may be considered as a reset state. When the reset signal is received, the dynamic divider circuit (106) may be configured to begin operating from the reset state (e.g., the dynamic divider circuit 106 returns to the 000 state in response to receiving the reset signal). In at least one example embodiment, each state may denote one or more latch/flip-flops performing a clock division. The /5 division begins from the reset state and traverses the states in the order of 000→100→110→111→011→001, but is not limited thereto. At the state 001, /5 division is complete. For a further /4 division, the state traversal begins from the state 001 and is represented by: 001→101→111→011→001. At the state 001, /4 is complete. The said /5 division and /4 division provide a /9 division. As mentioned, a further /2 division results in a /18 clock signal. Alternatively, the states can be traversed for a subsequent time in the dynamic divider circuit (106) to generate the /18 clock signal. In at least one example embodiment, the /36 clock signals can be obtained by performing the /5 division and /4 division four times. In at least one example embodiment, the /20 and /40 clock signals can be obtained by performing the /5 division four times and eight times respectively. In another example embodiment, /16 clock signals can be obtained by performing the /4 division four times.

Figure 9B:
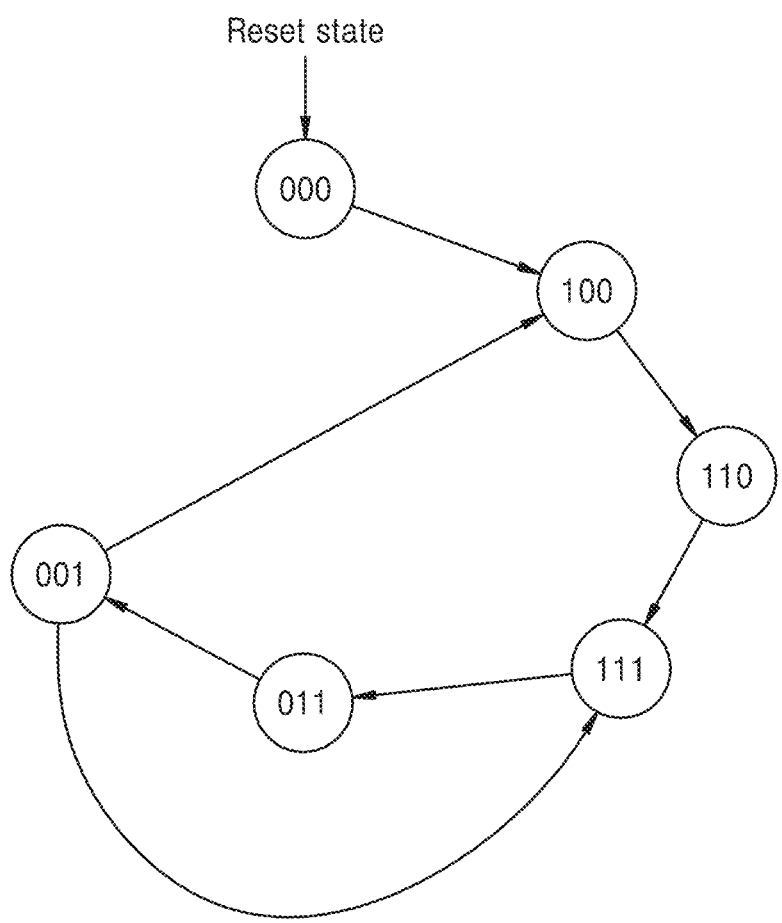

FIG. 9B shows a state diagram of the dynamic divider circuit (106) toggling between a /5 clock division and /3 clock division according to at least one example embodiment. In at least one example embodiment, when an input for generating a /16 clock division is received, the dynamic divider circuit (106) may be configured to perform a /5 division followed by a /3 division, which results in a /9 division. In at least one example embodiment, a subsequent /2 division results in a divided by 16 clock signal. In another example embodiment, the dynamic divider circuit (106) may perform repeat the /5 division and /3 division to generate a divided by 16 clock signal. As seen in the finite state machine of FIG. 9B, when the input is received for generating the parallel clock, the dynamic divider circuit (106) may begin in the state 000. The state 000 may be considered as a reset state. When the reset signal is received, the dynamic divider circuit (106) may be configured to begin operating from the reset state (and/or return to the reset state). In at least one example embodiment, each state may denote one or more latch/flip-flops performing a clock division. The /5 division begins from the reset state traverses the states in the order of 000→100→110→111→011→001. At the state 001, /5 division is complete. For a further /3 division, the state traversal begins from the state 001 and is represented by: 001→111→011→001. At the state 001, /3 is complete. The said /5 division and /3 division provide a /8 division. As mentioned, a further /2 division results in a /16 clock signal. Alternatively, the states can be traversed for a subsequent time in the dynamic divider circuit (106) to generate the /16 clock signal.

In at least one example embodiment, if /M division is followed by/N divisions, P parallel bits can be loaded for serialization. Here, M, N and P are integers greater than 0, such that P=(M+N)*2. For example, if 18-bits parallel data is to be serialized, then P=18 and M=5 and N=4. Thus (5+4)*2 results in 18.

Figure 10A:
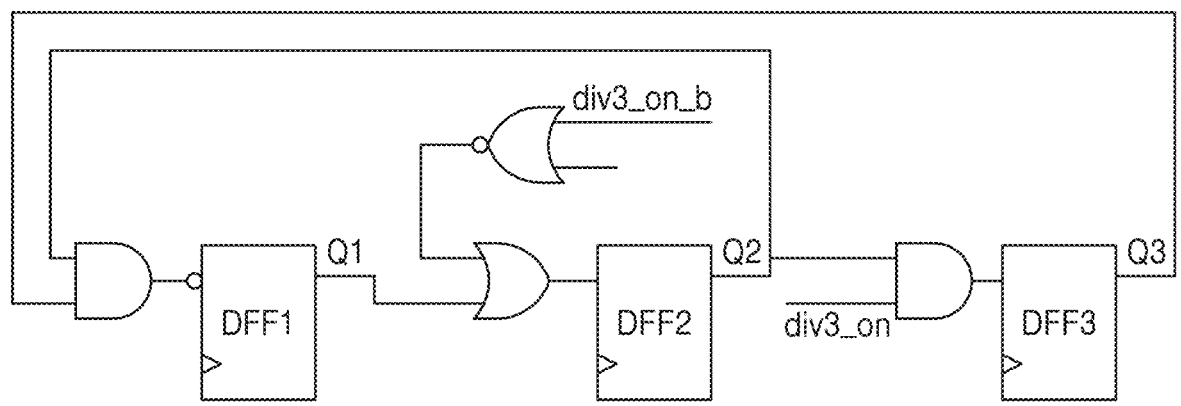
FIGS. 10A, 10B and 10C show example logic diagrams of a dynamic divider for unifying parallel interfaces, in accordance with some example embodiments.
Figure 10B:
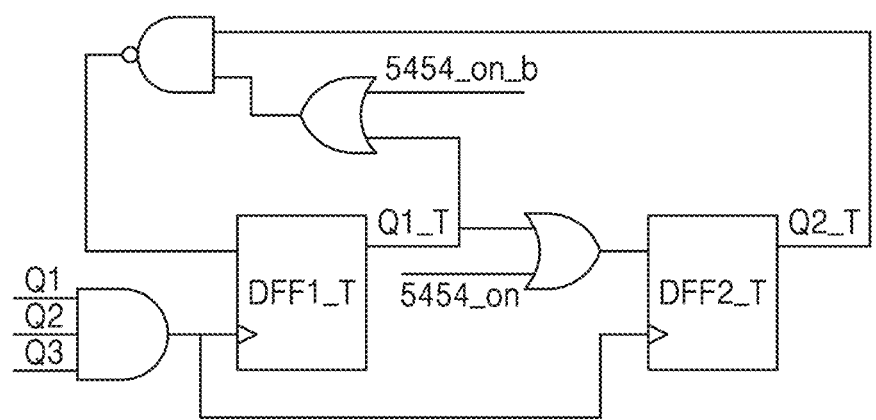
Figure 10C:
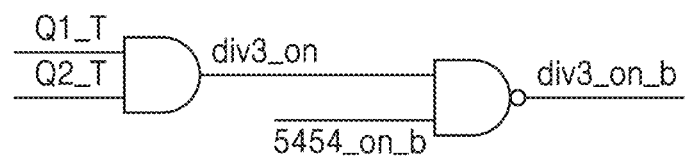

FIGS. 10A-10C illustrate logic diagrams of the dynamic divider circuit (106) according to some example embodiments. Typically, three flip-flops may be required to perform a clock division more than 5, but the example embodiments are not limited thereto. As shown in FIG. 10A, the three flip-flops are used to provide a /5, /4 and /3 division. FIG. 10B and FIG. 10C illustrates toggling the dynamic divider circuit (106) between /5 and /4 division. Referring now to FIG. 10B, Q1, Q2 and Q3 are the clock inputs provided to the flip-flops DFF1_T and DFF2_T via the AND gate and 5454_on and 5454_on_b are the inputs provided to the flip-flops DFF1_T and DFF2_T respectively. For the logic circuit as shown in FIG. 10B, the output signal Q1_T is made to toggle and the output signal Q2_T is always "1". The Q1_T and Q2_T signals are provided as inputs to the circuit shown in FIG. 10C. As Q2_T is always "1", the div3_on signal is always "0", and therefore, the div3_on_b signal is always "1". Referring back to FIG. 10A, the DFF1 and DFF2 flip-flops are always operated as the div3_on_b signal is always "1". Further, the DFF3 flip-flop is operated when the div3_on signal is "1" and DFF3 flop-flop is not operated when the div3_on signal is "0". Hence, /5 is possible when the DFF1, DFF2 and the DFF3 is operated. /4 or /3 is possible when DFF1 and DFF2 are operated. In at least one example embodiment, if the value of 5454_on="1" and the value of 5454_on_b="0", then the dynamic divider circuit (106) is operated in a first mode (/5 and /4 division) and if the value of 5454_on="0" and the value of 5454_on_b="1", then the dynamic divider circuit (106) is operated in a second mode (/5 and /3 division).

Figure 11:
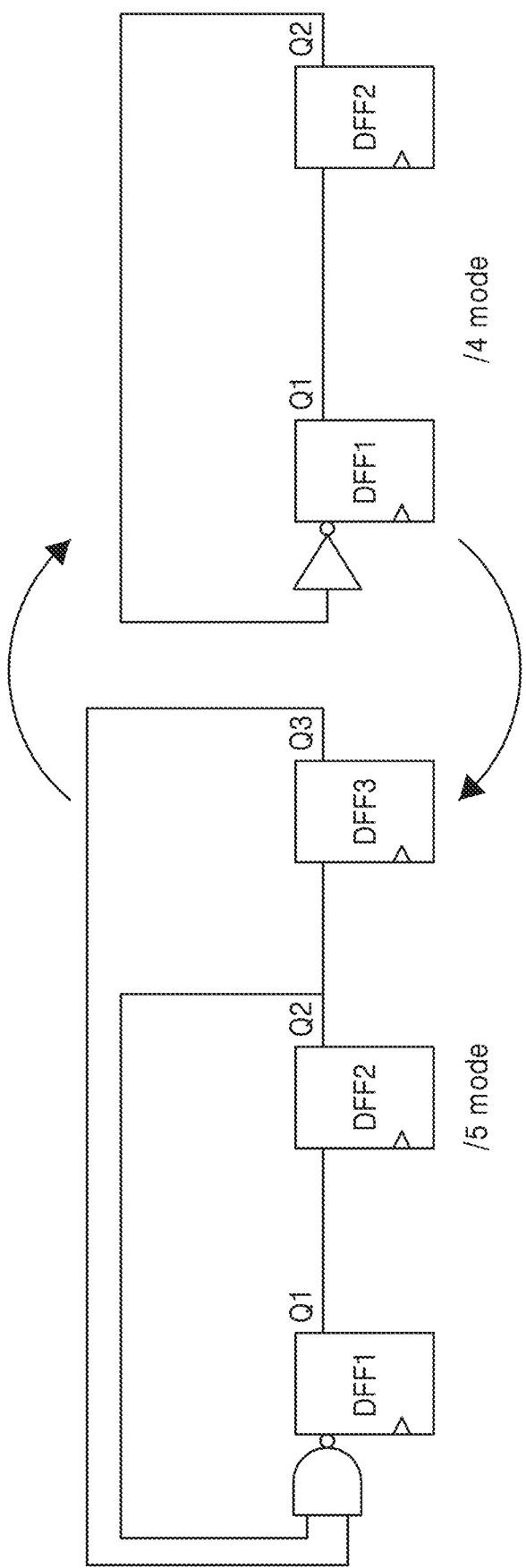
FIG. 11 shows an example logic diagram of a dynamic divider operated in a first mode for unifying parallel interfaces, in accordance with at least one example embodiment.

FIG. 11 illustrates the logic diagram of dynamic divider circuit (106) according to at least one example embodiment. As illustrated in the diagram, if the dynamic divider circuit (106) is operated in the first mode, the dynamic divider circuit may toggle between /5 division and /4 division. As described in FIG. 10A-10C, if the value of div3_on is "1", the dynamic divider circuit (106) is operated in /5 mode and if the value of div3_on is "0", the dynamic divider circuit (106) is operated in /4 mode. FIG. 11 illustrates the toggling between the /5 mode and the /4 mode, but the example embodiments are not limited thereto.

Figure 12:
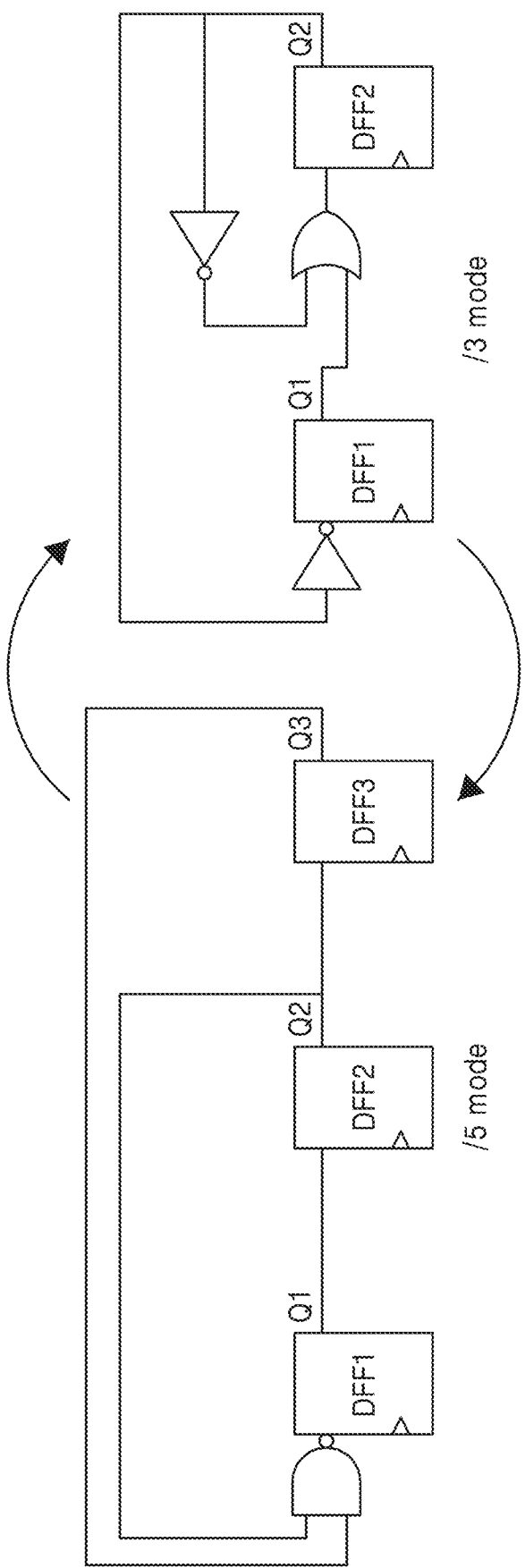
FIG. 12 shows an example logic diagram of a dynamic divider operated in a second mode for unifying parallel interfaces, in accordance with at least one example embodiment.

FIG. 12 illustrates the logic diagram of dynamic divider circuit (106) according to at least one example embodiment. As illustrated in the diagram, if the dynamic divider circuit (106) is operated in the second mode, the dynamic divider circuit may toggle between /5 division and /3 division. As described in FIG. 10A-10C, if the value of div3_on is "1", the dynamic divider circuit (106) is operated in /5 mode and if the value of div3_on is "0", the dynamic divider circuit (106) is operated in /3 mode. FIG. 12 illustrates the toggling between the /5 mode and the /3 mode, but the example embodiments are not limited thereto.

In at least one example embodiment, a method for high speed serialization of a of parallel input bits is disclosed. The method comprises configuring a dynamic divider circuit in conjunction with an input clock to operate one or more shift registers connected to the output of at least one multiplexer that handles a plurality of parallel input bits that need to be serialized. Further, the method comprises setting the dynamic divider circuit at a first variable division of the input clock for loading the parallel input bits into one or more shift registers. Thereafter, the method comprises generating a serial output as a result of loading and shifting the parallel input bits in the one or more shift registers.

In at least one example embodiment, the proposed apparatus, system, and method unifies 16-bit, 18-bit and 20-bit half-rate parallel interfaces, but is not limited thereto.

In at least one example embodiment, the proposed apparatus, system, and method unifies 16-bit, 18-bit and 20-bit quarter-rate parallel interfaces, but is not limited thereto.

In at least one example embodiment, the proposed apparatus, system, and method unifies 36-bit and 40-bit half-rate parallel interfaces, but is not limited thereto.

In at least one example embodiment, the proposed apparatus, system, and method unifies 36-bit and 40-bit quarter-rate parallel interfaces, but is not limited thereto.

In at least one example embodiment, the dynamic divider circuit (106) can be configured to unify 12-bit, 14-bit and 16-bit parallel interface by providing /4, /3 and /2 circuits, but is not limited thereto.

In at least one example embodiment, the proposed apparatus, system, and method removes the requirement of multiple dividers for different parallel interfaces, but is not limited thereto.

In at least one example embodiment, a flexibility to add pad bits at different bit position is provided.

The terms "an embodiment", "embodiment", "embodiments", "the embodiment", "the embodiments", "one or more embodiments", "some embodiments", and "one embodiment" mean "one or more (but not all) example embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise. The terms "a", "an" and "the" mean "one or more", unless expressly specified otherwise.

A description of at least one example embodiment with several components in communication with each other does not imply that all such components are required. On the contrary a variety of optional components are described to illustrate the wide variety of possible example embodiments of the inventive concepts.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other example embodiments of the inventive concepts need not include the device itself.

The illustrated operations of FIG. 2 shows certain events occurring in a certain order. In alternative example embodiments, certain operations may be performed in a different order, modified or removed. Moreover, steps may be added to the above described logic and still conform to the described example embodiments. Further, operations described herein may occur sequentially or certain operations may be processed in parallel. Yet further, operations may be performed by a single processing unit or by distributed processing units.

Finally, the language used in the specification has been principally selected for readability and instructional purposes, and it may not have been selected to delineate or circumscribe the inventive concepts. It is therefore intended that the scope of the inventive concepts be limited not by this detailed description, but rather by any claims that issue on an application based here on. Accordingly, the disclosure of the example embodiments of the inventive concepts is intended to be illustrative, but not limiting, of the scope of the inventive concepts, which is set forth in the following claims.

While various aspects and example embodiments have been disclosed herein, other aspects and example embodiments will be apparent to those skilled in the art. The various aspects and example embodiments disclosed herein are for purposes of illustration and are not intended to be limiting, with the true scope being indicated by the following claims.

We claim:

1. A transmitting apparatus for unifying parallel interfaces, the transmitting apparatus comprising:
    an input clock generator configured to generate an input clock signal of a desired frequency;
    a dynamic divider circuit configured to,
        receive the input clock signal,
        generate a parallel clock signal by dividing the desired frequency of the input clock signal based on a variable division input, the variable division input selected based on a variable parallel data input, and provide the parallel clock signal to one or more shift registers;
    the one or more shift registers configured to receive the variable parallel data input based on the parallel clock signal, and shift the variable parallel data input to generate a bit stream; and
    at least one multiplexer associated with a serial clock signal, the at least one multiplexer configured to receive the bit stream from each of the one or more shift registers, and output at least one bit of a serial bit stream based on a serial clock frequency of the serial clock signal.

2. The transmitting apparatus as claimed in claim 1, wherein
    the variable parallel data input is 18-bits wide; and
    the dynamic divider circuit is further configured to,
        perform a first variable division comprising a divide by 5 operation and a divide by 4 operation on the input clock signal to enable the one or more shift registers to receive the 18-bit wide variable parallel data input.

3. The transmitting apparatus as claimed in claim 1, wherein
    the variable parallel data input is 20-bits wide; and
    the dynamic divider circuit is further configured to,
        perform a second variable division comprising a first divide by 5 operation and a second divide by 5 operation on the input clock signal to enable the one or more shift registers to receive the 20-bit wide variable parallel data input.

4. The transmitting apparatus as claimed in claim 1, wherein
    the variable parallel data input is 36-bits wide; and
    the dynamic divider circuit is further configured to,
        perform a third variable division comprising a first divide by 5 operation, a first divide by 4 operation, a second divide by 5 operation, and a second divide by 4 operation on the input clock signal to enable the one or more shift registers to receive the 36-bit wide variable parallel data input.

5. The transmitting apparatus as claimed in claim 1, wherein
    the variable parallel data input is 40-bits wide; and
    the dynamic divider circuit is further configured to,
        perform a fourth variable division comprising a first divide by 5 operation, a second divide by 5 operation, a third divide by 5 operation, and a fourth divide by 5 operation on the input clock signal to enable the one or more shift registers to receive the 40-bit wide variable parallel data input.

6. The transmitting apparatus as claimed in claim 1, wherein
    the one or more shift registers includes a first shift register and a second shift register;
    the first shift register is configured to store even bits of the variable parallel data input; and
    the second shift register is configured to store odd bits of the variable parallel data input.

7. The transmitting apparatus as claimed in claim 1, wherein the dynamic divider circuit is further configured to enable bit padding after every interval of a desired number of bits of the serial bit stream.

8. The transmitting apparatus as claimed in claim 1, further comprising:

a serial clock generator configured to generate the serial clock signal based on the desired frequency of the input clock signal.

9. The transmitting apparatus as claimed in claim 1, wherein the dynamic divider circuit is further configured to receive the variable division input from a user.

10. A method for unifying parallel interfaces of a transmitting apparatus, the method comprising:
receiving, by a dynamic divider circuit, an input clock signal, the input clock signal including a desired clock frequency;
generating, by the dynamic divider circuit, a parallel clock signal by dividing the desired clock frequency of the input clock signal based on a variable division input, the variable division input selected based on a variable parallel data input;
providing, by the dynamic divider circuit, the parallel clock signal to one or more shift registers;
receiving, by the one or more shift registers, the variable parallel data input based on the parallel clock signal;
shifting, by the one or more shift registers, the variable parallel input bits to generate a bit stream;
receiving, by at least one multiplexer, the bit stream from each of the one or more shift registers; and
outputting, by the at least one multiplexer, at least one bit of a serial bit stream based on a serial clock frequency of a serial clock signal associated with the at least one multiplexer.

11. The method as claimed in claim 10, further comprising:
performing, by the dynamic divider circuit, a first variable division, the first variable division including a divide by 5 operation and a divide by 4 operation on the input clock signal to enable the one or more shift registers to receive the variable parallel data input, the variable parallel data input being 18-bits wide.

12. The method as claimed in claim 10, further comprising:
performing, by the dynamic divider circuit, a second variable division, the second variable division including a first divide by 5 operation and a second divide by 5 operation on the input clock signal to enable the one or more shift registers to receive the variable parallel data input, the variable parallel data input being 20-bits wide.

13. The method as claimed in claim 10, further comprising:
performing, by the dynamic divider circuit, a third variable division, the third variable division including a first divide by 5 operation, a first divide by 4 operation, a second divide by 5 operation, and a second divide by 4 operation on the input clock signal to enable the one or more shift registers to receive the variable parallel data input, the variable parallel data input being 36-bits wide.

14. The method as claimed in claim 10, further comprising:
performing, by the dynamic divider circuit, a fourth variable division, the fourth variable division including a first divide by 5 operation, a second divide by 5 operation, a third divide by 5 operation, and a fourth divide by 5 operation on the input clock signal to enable the one or more shift registers to receive the variable parallel data input, the variable parallel data input being 40-bits wide.

15. The method as claimed in claim 10, wherein
the one or more shift registers includes a first shift register and a second shift register; and
the method further comprises,
storing, by the first shift register, even bits of the variable parallel data input; and
storing, by the second shift register, odd bits of the variable parallel data input.

16. A method for high speed serialization of parallel input bits to be serialized, comprising:
configuring a dynamic divider circuit based on an input clock signal of a desired clock frequency;
setting the dynamic divider circuit at a first variable division of the input clock signal for loading the parallel input bits into one or more shift registers, the one or more shift registers connected to an output of at least one multiplexer that receives the parallel input bits; and
generating a serial data output based on loading and shifting the parallel input bits using the one or more shift registers.

17. The method as claimed in claim 16, further comprising:
performing a first variable division using the dynamic divider circuit, the first variable division including a divide by 5 operation and a divide by 4 operation on the input clock signal to enable the one or more shift registers to receive the parallel input bits, the parallel input bits being 18-bits wide.

18. The method as claimed in claim 16, further comprising:
performing a second variable division using the dynamic divider circuit, the second variable division including a first divide by 5 operation, and a second divide by 5 operation on the input clock signal to enable the one or more shift registers to receive the parallel input bits, the parallel input bits being 20-bits wide.

19. The method as claimed in claim 16, further comprising:
performing a third variable division using the dynamic divider circuit, the third variable division including a first divide by 5 operation, a first divide by 4 operation, a second divide by 5 operation, and a second divide by 4 operation on the input clock signal to enable the one or more shift registers to receive the parallel input bits, the parallel input bits being 36-bits wide.

20. The method as claimed in claim 16, further comprising:
performing a fourth variable division using the dynamic divider circuit, the fourth variable division including a first divide by 5 operation, a second divide by 5 operation, a third divide by 5 operation, and a fourth divide by 5 operation on the input clock signal to enable the one or more shift registers to receive the parallel input bits, the parallel input bits being 40-bits wide.

* * * * *